(12) United States Patent
Kawauchi et al.

(10) Patent No.: US 8,575,469 B2
(45) Date of Patent: Nov. 5, 2013

(54) THERMOELECTRIC CONVERSION MODULE AND METHOD FOR MANUFACTURING THE SAME

(75) Inventors: Yasuhiro Kawauchi, Nagaokakyo (JP); Takanori Nakamura, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 24 days.

(21) Appl. No.: 13/252,223

(22) Filed: Oct. 4, 2011

(65) Prior Publication Data

US 2012/0021551 A1    Jan. 26, 2012

Related U.S. Application Data

(60) Division of application No. 12/195,538, filed on Aug. 21, 2008, which is a continuation of application No. PCT/JP2006/318116, filed on Sep. 13, 2006.

(30) Foreign Application Priority Data

Feb. 22, 2006 (JP) .................................. 2006-044912

(51) Int. Cl.
*H01L 35/12* (2006.01)
(52) U.S. Cl.
USPC ........................................ 136/236.1; 136/205
(58) Field of Classification Search
USPC ...................... 136/224, 236.1, 205
See application file for complete search history.

(56) References Cited

U.S. PATENT DOCUMENTS 6,121,539 A * 9/2000 Johnson et al. ............... 136/203
6,673,996 B2 * 1/2004 Caillat et al. .................. 136/201

OTHER PUBLICATIONS

Kawauchi et al.; "Thermoelectric Conversion Module and Method for Manufacturing the Same"; U.S. Appl. No. 12/195,538, filed Aug. 21, 2008.

* cited by examiner

*Primary Examiner* — Jonathan J. Johnson
*Assistant Examiner* — Devina Pillay
(74) *Attorney, Agent, or Firm* — Keating & Bennett, LLP

(57) ABSTRACT

A compact, high-performance thermoelectric conversion module includes a laminate having a plurality of insulating layers, p-type thermoelectric semiconductors and n-type thermoelectric semiconductors formed by a technique for manufacturing a multilayer circuit board, particularly a technique for forming a via-conductor. Pairs of the p-type thermoelectric semiconductors and the n-type thermoelectric semiconductors are electrically connected to each other in series through p-n connection conductors to define thermoelectric conversion element pairs. The thermoelectric conversion element pairs are connected in series through, for example, series wiring conductors. The thermoelectric semiconductors each have a plurality of portions in which the peak temperatures of thermoelectric figures of merit are different from each other. These portions are distributed in the stacking direction of the laminate.

4 Claims, 7 Drawing Sheets

THERMOELECTRIC CONVERSION MODULE AND METHOD FOR MANUFACTURING THE SAME

BACKGROUND OF THE INVENTION

1. Field of the Invention

The present invention relates to a thermoelectric conversion module and a method for manufacturing the thermoelectric conversion module, and more particularly, to an improvement in a method for manufacturing a compact, high-performance thermoelectric conversion module.

2. Description of the Related Art

Conventional techniques relating to the present invention are disclosed in Japanese Unexamined Patent Application Publication No. 8-153899 and Japanese Unexamined Patent Application Publication No. 8-222770.

Japanese Unexamined Patent Application Publication No. 8-153899 discloses a thermoelectric conversion module including an insulating frame having a plurality of through-holes spaced from each other. The through-holes contain p-type or n-type compound semiconductor elements. The through-holes containing the p-type compound semiconductor elements and the through-holes containing the n-type compound semiconductor elements are alternately arranged. Electrodes are arranged on the upper and lower surfaces of the frame so as to electrically connect pairs of the p-type and n-type compound semiconductor elements to each other in series. As disclosed in Japanese Unexamined Patent Application Publication No. 8-153899, the frame is made of glass or ceramic.

In the thermoelectric conversion module disclosed in Japanese Unexamined Patent Application Publication No. 8-153899, the p-type and n-type compound semiconductor elements are each made of one type of compound semiconductor material. That is, one through-hole contains one type of compound semiconductor material. Therefore, the thermoelectric figure of merit of each element peaks at one temperature, that is, the element has a single conversion peak. Thus, the element has relatively low thermoelectric conversion efficiency.

Japanese Unexamined Patent Application Publication No. 8-222770 discloses a method for manufacturing a thermoelectric conversion module. The method includes a step of preparing n-type laminates such that tabular n-type thermoelectric semiconductors and tabular insulators are alternately stacked and the stack is cut substantially perpendicularly to the lamination plane, a step of preparing p-type laminates such that tabular p-type thermoelectric semiconductors and tabular insulators are alternately stacked and the stack is cut substantially perpendicularly to the lamination plane, a step of alternately stacking the n-type laminates and the p-type laminates such that the insulators are sandwiched between the n-type and p-type laminates, and a step of forming wiring conductors connecting the n-type thermoelectric semiconductors to the p-type thermoelectric semiconductors adjacent thereto in series. As disclosed in Japanese Unexamined Patent Application Publication No. 8-222770, the insulators are made of an epoxy resin.

According to the method disclosed in Japanese Unexamined Patent Application Publication No. 8-222770, the n-type and p-type laminates are likely to be misaligned with each other in the step of alternately stacking the n-type and p-type laminates. This prevents the thermoelectric semiconductors and the wiring conductors from being properly electrically connected to each other. Therefore, the thermoelectric semiconductors and the wiring conductors may be electrically disconnected from each other or short-circuited.

SUMMARY OF THE INVENTION

To overcome the above-described problems, preferred embodiments of the present invention provide a thermoelectric conversion module and a method for manufacturing the thermoelectric conversion module.

A thermoelectric conversion module according to a preferred embodiment of the present invention includes a p-type thermoelectric semiconductor, an n-type thermoelectric semiconductor, and a laminate including a plurality of insulating layers which are electrically insulative and which are stacked.

The laminate includes at least one first accommodation hole accommodating the p-type thermoelectric semiconductor, at least one second accommodation hole accommodating the n-type thermoelectric semiconductor, and a p-n connection conductor that electrically connects the p-type and n-type thermoelectric semiconductors to each other in series such that the p-type and n-type thermoelectric semiconductors define a thermoelectric conversion element pair.

The first accommodation hole is defined by a plurality of first perforations which are communicatively connected to each other and which extend through the insulating layers in the thickness direction of the insulating layers and the second accommodation hole is defined by a plurality of second perforations which are communicatively connected to each other and which extend through the insulating layers in the thickness direction of the insulating layers.

At least one of the p-type and n-type thermoelectric semiconductors includes a plurality of portions in which the peak temperatures of thermoelectric figures of merit are different from each other and the portions are distributed in the stacking direction of the laminate.

Both of the p-type and n-type thermoelectric semiconductors preferably include the portions in which the peak temperatures of thermoelectric figures of merit are different from each other.

The laminate preferably includes a plurality of thermoelectric conversion element pairs. In this case, the laminate includes a plurality of series wiring conductors arranged to connect the thermoelectric conversion element pairs in series or includes a plurality of parallel wiring conductors arranged to connect the thermoelectric conversion element pairs in parallel.

Another preferred embodiment of the present invention provides a method for manufacturing a thermoelectric conversion module that includes a p-type thermoelectric semiconductor, an n-type thermoelectric semiconductor, and a laminate including a plurality of insulating layers which are electrically insulative and which are stacked. The laminate has at least one first accommodation hole accommodating the p-type thermoelectric semiconductor, at least one second accommodation hole accommodating the n-type thermoelectric semiconductor, and a p-n connection conductor which electrically connects the p-type and n-type thermoelectric semiconductors to each other in series such that the p-type and n-type thermoelectric semiconductors define a thermoelectric conversion element pair. The first accommodation hole is defined by a plurality of first perforations which are communicatively connected to each other and which extend through the insulating layers in the thickness direction of the insulating layers. The second accommodation hole is defined by a plurality of second perforations which are communicatively connected to each other and which extend through the insulating layers in the thickness direction of the insulating layers.

The thermoelectric conversion module-manufacturing method according to this preferred embodiment of the present invention includes a step of preparing a plurality of insulating sheets for forming the insulating layers, a step of preparing a p-type thermoelectric semiconductor material for forming the p-type thermoelectric semiconductor and an n-type thermoelectric semiconductor material for forming the n-type thermoelectric semiconductor, a step of forming the first and second perforations in the insulating sheets, a step of packing the p-type thermoelectric semiconductor material and the n-type thermoelectric semiconductor material into the first perforation and the second perforation, respectively, a step of forming the p-n connection conductor on a specific one of the insulating sheets, and a step of stacking the insulating sheets such that the laminate is obtained.

A thermoelectric conversion module manufactured by the method according to preferred embodiments of the present invention is not limited to the above-described thermoelectric conversion module according to the present invention. The method according to preferred embodiments of the present invention can be used to manufacture a thermoelectric conversion module that does not have the above-mentioned configuration in which at least one of the p-type and n-type thermoelectric semiconductors includes a plurality of portions in which the peak temperatures of thermoelectric figures of merit are different from each other. However, the method according to preferred embodiments of the present invention is preferably used to manufacture the thermoelectric conversion module according to preferred embodiments of the present invention.

In a preferred embodiment, the semiconductor-preparing step includes a sub-step of preparing different types of thermoelectric semiconductor components for producing at least one of the p-type and n-type thermoelectric semiconductor materials such that the thermoelectric semiconductor includes a plurality of portions in which the peak temperatures of thermoelectric figures of merit are different from each other, the packing step includes a sub-step of packing the different types of thermoelectric semiconductor components into the perforations of the insulating sheets, and the stacking step includes a sub-step of stacking the insulating sheets having the perforations filled with the different types of thermoelectric semiconductor components such that the insulating sheets are arranged in the laminate in a mixed manner.

When the laminate, which is included in the thermoelectric conversion module, includes a plurality of thermoelectric conversion element pairs and series wiring conductors arranged to connect the series wiring conductors to each other in series, the method preferably further includes a step of forming the series wiring conductors on a specific one of the insulating sheets.

When the laminate, which is included in the thermoelectric conversion module, includes a plurality of thermoelectric conversion element pairs and parallel wiring conductors arranged to connect the series wiring conductors to each other in parallel, the method preferably further includes a step of forming the parallel wiring conductors on a specific one of the insulating sheets.

In the thermoelectric conversion module-manufacturing method according to a preferred embodiment of the present invention, the insulating sheets are preferably green ceramic sheets. In this case, a step of firing the laminate is performed subsequently to the stacking step.

Preferably, at least one of a p-type thermoelectric semiconductor and an n-type thermoelectric semiconductor includes a plurality of portions in which the peak temperatures of thermoelectric figures of merit are different from each other and the portions are distributed in the stacking direction of a laminate. Thus, a cascade structure can be achieved and high thermoelectric conversion efficiency can be obtained over a specific temperature range.

When both of the p-type thermoelectric semiconductor and the n-type thermoelectric semiconductor include the portions in which the peak temperatures of thermoelectric figures of merit are different from each other, the thermoelectric conversion module has an improved thermoelectric conversion efficiency.

When the laminate includes thermoelectric conversion element pairs, the thermoelectric conversion element pairs can be electrically connected to each other through wiring conductors included in the laminate. The thermoelectric conversion module can be designed with relatively high flexibility. Therefore, the thermoelectric conversion module can be readily manufactured so as to have various characteristics. In the case in which the thermoelectric conversion module is used as a power generator, high voltage can be obtained by attaching series wiring conductors, for connecting the thermoelectric conversion element pairs to each other in series, to the laminate or a large current can be obtained by attaching parallel wiring conductors, for connecting the thermoelectric conversion element pairs to each other in parallel, to the laminate.

A method for manufacturing the thermoelectric conversion module according to preferred embodiments of the present invention includes steps substantially identical to those of a method for manufacturing a multilayer circuit board. The laminate, which is included in the thermoelectric conversion module, corresponds to the multilayer circuit board, the thermoelectric semiconductors correspond to via-conductors, and a p-n connection conductor and the series and parallel wiring conductors correspond to conductive layers disposed between insulating layers included in a multilayer circuit board.

The thermoelectric conversion module-manufacturing method enables the thermoelectric semiconductors, which correspond to such via-conductors, to be densely arranged in the laminate. Therefore, the thermoelectric conversion module can be readily manufactured so as to have a small size and high performance.

The wiring conductors and the thermoelectric conversion element pairs, as well as the multilayer circuit board, can be flexibly designed. Thus, the thermoelectric conversion module can be readily manufactured so as to have desired characteristics.

According to the thermoelectric conversion module-manufacturing method, the thermoelectric semiconductors are formed such that the perforations are formed in the insulating sheets, the thermoelectric semiconductor material is packed into the perforations, and the insulating sheets are then stacked. Therefore, one of the thermoelectric semiconductors is not misaligned with another one thereof. This enables the thermoelectric conversion module to be protected from electrical faults or short circuits.

Where the manufacturing method according to preferred embodiments of the present invention is used to manufacture a thermoelectric conversion module in which thermoelectric semiconductors include portions in which the peak temperatures of thermoelectric figures of merit are different from each other and the portions are distributed in the stacking direction of a laminate, this thermoelectric conversion module can be readily manufactured such that different types of thermoelectric semiconductor materials are prepared and then packed into perforations of other insulating sheets and the insulating sheets having the perforations filled with the different types of thermoelectric semiconductor materials are stacked such that the insulating sheets are arranged in the laminate in a mixed manner.

If the insulating sheets are green ceramic sheets and a step of firing the laminate is performed subsequently to a stacking step in the thermoelectric conversion module-manufacturing method according to preferred embodiments of the present invention, the thermoelectric conversion module can be manufactured through steps substantially identical to those of a method for manufacturing a conventional multilayer ceramic circuit board. The commonality of manufacturing facilities allows the thermoelectric conversion module to be manufactured at low cost.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
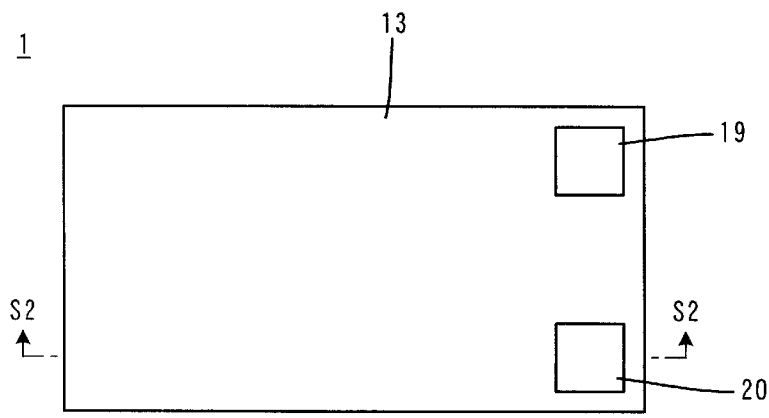
FIG. 1 is a plan view of a thermoelectric conversion module according to a first preferred embodiment of the present invention.
Figure 2:
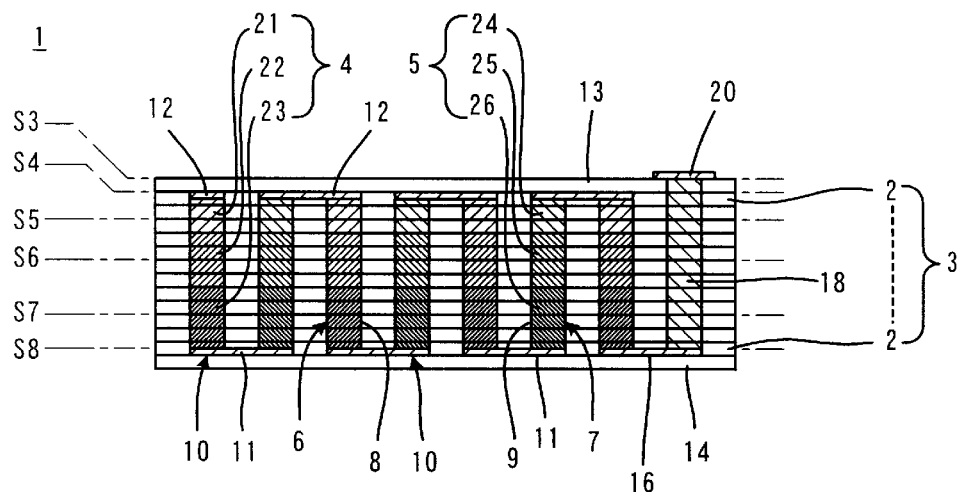
FIG. 2 is a sectional view taken along the line S2-S2 of FIG. 1.
Figure 3:
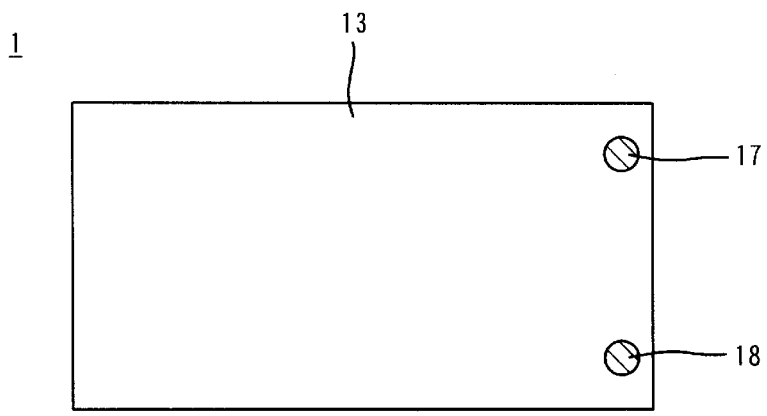
FIG. 3 is a sectional plan view taken along the line S3 of FIG. 2.

FIGS. 1 to 8 illustrate a thermoelectric conversion module 1 according to a first preferred embodiment of the present invention. FIG. 1 is a plan view of the thermoelectric conversion module 1. FIG. 2 is a sectional view taken along the line S2-S2 of FIG. 1. FIGS. 3 to 8 are sectional plan views taken along the lines S3 to S8, respectively, of FIG. 2.

The thermoelectric conversion module 1 includes a laminate 3 including a plurality of stacked insulating layers 2 which are electrically insulative. The insulating layers 2 are made of an alumina-based material, such as a $BaO-Al_2O_3-SiO_2$ ceramic material or a $ZnO-MgO-Al_2O_3-SiO_2$ glass material, for example. The thermoelectric conversion module 1 further includes a plurality of p-type thermoelectric semiconductors 4 and n-type thermoelectric semiconductors 5 arranged in the laminate 3. The p-type thermoelectric semiconductors 4 are made of, for example, Chromel. The n-type thermoelectric semiconductors 5 are made of, for example, Constantan. The p-type thermoelectric semiconductors 4 and the n-type thermoelectric semiconductors 5 are alternately arranged in vertical and horizontal directions as shown in FIGS. 2 and 5 to 7.

The laminate 3 has a plurality of first accommodation holes 6 accommodating the p-type thermoelectric semiconductors 4 and a plurality of second accommodation holes 7 accommodating the n-type thermoelectric semiconductors 5. The first accommodation holes 6 are each defined by a plurality of first perforations 8 extending through some of the insulating layers 2 in the thickness direction thereof. The second accommodation holes 7 are each defined by a plurality of second perforations 9 extending through some of the insulating layers 2 in the thickness direction thereof.

Figure 8:
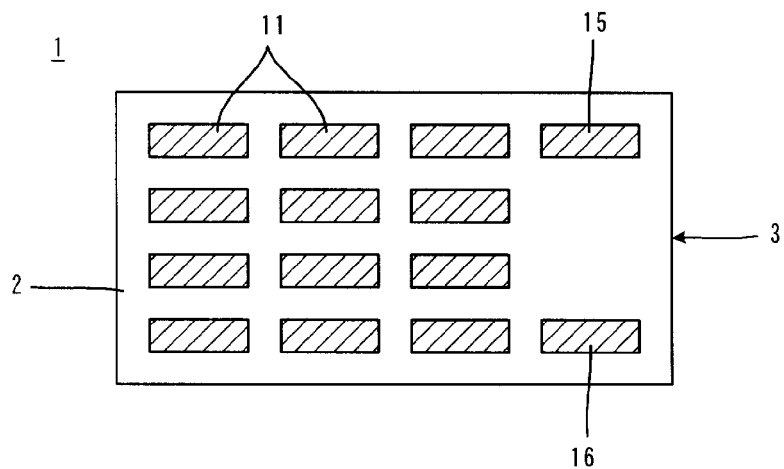
FIG. 8 is a sectional plan view taken along the line S8 of FIG. 2.

The laminate 3 includes p-n connection conductors 11 that electrically connecting pairs of the p-type thermoelectric semiconductors 4 and n-type thermoelectric semiconductors 5 to each other in series such that each p-type thermoelectric semiconductor 4 and n-type thermoelectric semiconductor 5 define a thermoelectric conversion element pair 10. The p-n connection conductors 11 are arranged on the outer surface of one of the outermost insulating layers 2 of the laminate 3 as shown in FIGS. 2 and 8.

Figure 4:
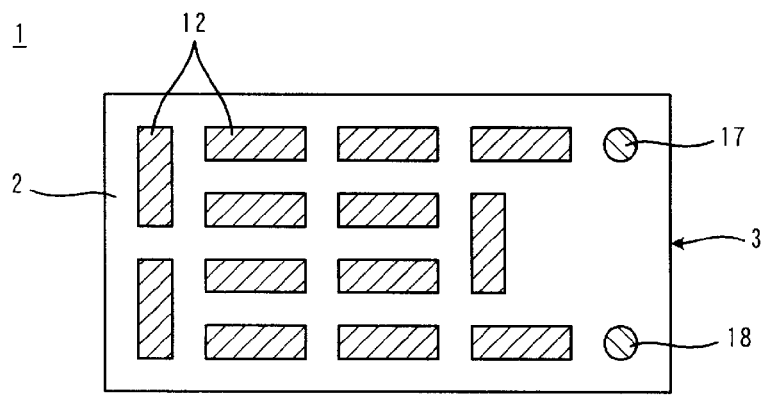
FIG. 4 is a sectional plan view taken along the line S4 of FIG. 2.

In this preferred embodiment, the thermoelectric conversion element pairs 10 are connected to each other in series such that a high voltage is obtained. The laminate 3 further includes a plurality of series wiring conductors 12 arranged to sequentially connect the thermoelectric conversion element pairs 10 to each other in series. The series wiring conductors 12 are arranged on the outer surface of the other one of the outermost insulating layers 2 of the laminate 3 as shown in FIGS. 2 and 4.

The thermoelectric conversion module 1 further includes a pair of outer layers 13 and 14 sandwiching the laminate 3. The outer layers 13 and 14 are in contact with cold and hot junctions of the thermoelectric semiconductors 4 and 5 and are preferably made of a material which is electrically insulative and which has relatively good heat conductivity. The outer layers 13 and 14 are made of, for example, the same material as that for forming the insulating layers 2.

The thermoelectric conversion module 1 further includes extraction conductive layers 15 and 16, extraction via-conductors 17 and 18, and terminal electrodes 19 and 20 for extracting electricity from the thermoelectric conversion element pairs 10, which are connected to each other in series. The extraction conductive layers 15 and 16, as well as the p-n connection conductors 11, are arranged on the outer surface of one of the outermost insulating layers 2 of the laminate 3 as shown in FIGS. 2 and 8. The extraction via-conductors 17 and 18 are electrically connected to the extraction conductive layers 15 and 16, respectively, extend through the laminate 3 and the outer layer 13, and are electrically connected to the terminal electrodes 19 and 20, respectively. The terminal electrodes 19 and 20 are arranged on the outer surface of the outer layer 13.

The following members are made of a conductive material including a conductive component, such as Cu, for example: the extraction conductive layers 15 and 16, the extraction via-conductors 17 and 18, the terminal electrodes 19 and 20, the p-n connection conductors 11, and the series wiring conductors 12.

Figure 5:
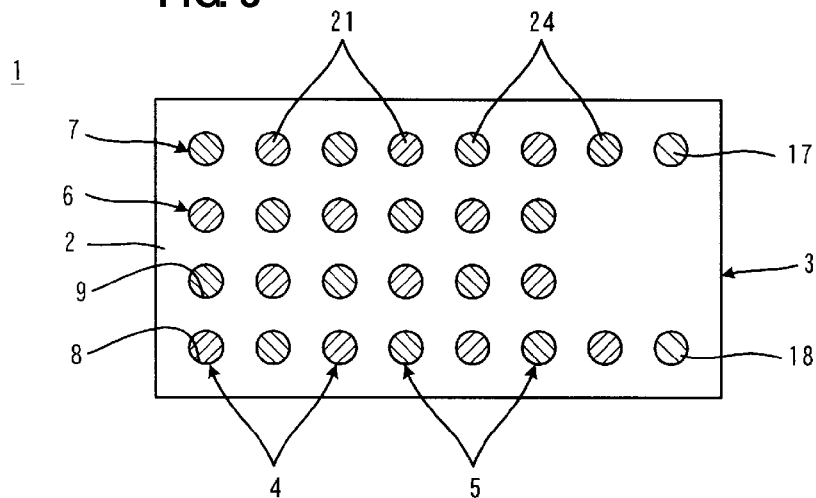
FIG. 5 is a sectional plan view taken along the line S5 of FIG. 2.
Figure 6:
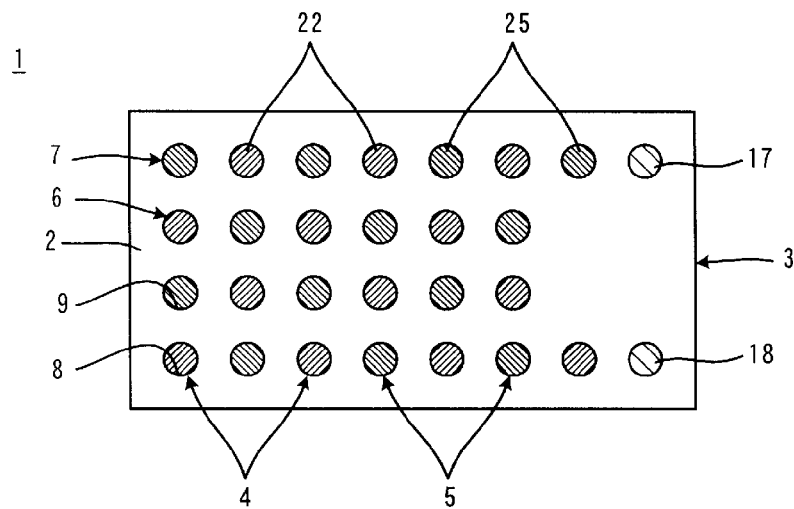
FIG. 6 is a sectional plan view taken along the line S6 of FIG. 2.
Figure 7:
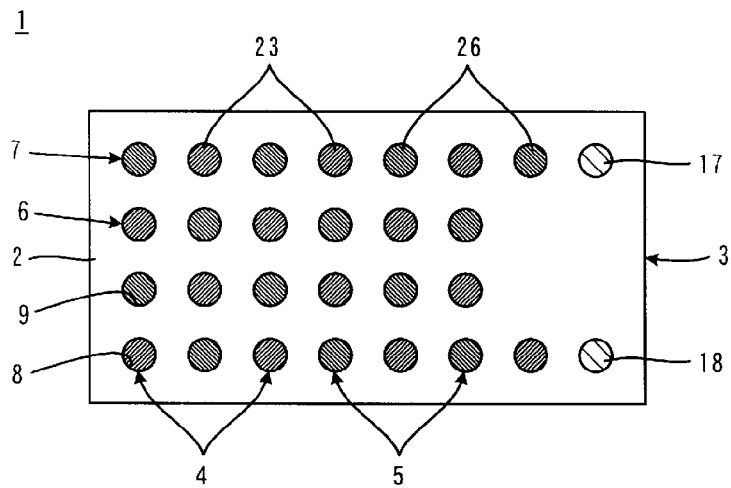
FIG. 7 is a sectional plan view taken along the line S7 of FIG. 2.

In the thermoelectric conversion module 1, the p-type thermoelectric semiconductors 4 and the n-type thermoelectric semiconductors 5 include a plurality of portions in which the peak temperatures of thermoelectric figures of merit are different from each other. In the present application, "peak temperature of thermoelectric figure of merit" means the temperature at which the thermoelectric figure of merit has the greatest value. In particular, the p-type thermoelectric semiconductors 4 include low-peak temperature portions 21 having a relatively low peak temperature, medium-peak temperature portions 22 having a medium peak temperature, and high-peak temperature portions 23 having a relatively high peak temperature. The n-type thermoelectric semiconductors 5 include low-peak temperature portions 24 having a relatively low peak temperature, medium-peak temperature portions 25 having a medium peak temperature, and high-peak temperature portions 26 having a relatively high peak temperature. As shown in FIG. 5, the low-peak temperature portions 21 and 24 appear at the cutting plane S5 of FIG. 2. As shown in FIG. 6, the medium-peak temperature portions 22 and 25 appear at the cutting plane S6 of FIG. 2. As shown in FIG. 7, the high-peak temperature portions 23 and 26 appear at the cutting plane S7 of FIG. 2. As is clear from this configuration, the portions 21 to 23 and 24 to 26 are distributed in the stacking direction of the laminate 3.

The low-peak temperature portions 21 and 24, the medium-peak temperature portions 22 and 25, and the high-peak temperature portions 23 and 26 may be varied in the order of arrangement, thickness (size measured in the stacking direction), and/or other features thereof.

Since the thermoelectric semiconductors 4 and 5 have a cascade structure including the portions 21 to 23 and 24 to 26, in which the peak temperatures of thermoelectric figures of merit are different from each other, the thermoelectric conversion module 1 has outstanding thermoelectric conversion efficiency over a specific temperature range.

A preferable method for manufacturing the thermoelectric conversion module 1 will now be described.

A plurality of insulating sheets for forming the insulating layers 2 are prepared. The insulating sheets are preferably green ceramic sheets including a $BaO—Al_2O_3—SiO_2$ ceramic material. The first and second perforations 8 and 9 are formed in the insulating sheets using, for example, a laser. Other insulating sheets, having the same composition as that of those insulating sheets, for forming the outer layers 13 and 14 are prepared.

The following materials are prepared: p-type thermoelectric semiconductor materials for forming the p-type thermoelectric semiconductors 4 and n-type thermoelectric semiconductor materials for forming the n-type thermoelectric semiconductors 5. Each p-type thermoelectric semiconductor material is prepared such that a Chromel powder and an organic vehicle are mixed into a paste. Each n-type thermoelectric semiconductor material is prepared such that a Constantan powder and an organic vehicle are mixed into a paste. The p-type and n-type thermoelectric semiconductor materials have thermoelectric figures of merit of which the peak temperatures are different from each other. The p-type thermoelectric semiconductor materials are classified into three types: one for the low-peak temperature portions 21, another one for the medium-peak temperature portions 22, and the other one for the high-peak temperature portions 23. The n-type thermoelectric semiconductor materials are classified into three types: one for the low-peak temperature portions 24, another one for the medium-peak temperature portions 25, and the other one for the high-peak temperature portions 26.

The p-type thermoelectric semiconductor materials and the n-type thermoelectric semiconductor materials are packed into the first perforations 8 and the second perforations 9, respectively. In this step, the p-type thermoelectric semiconductor materials are packed into the first perforations 8 such that the second perforations 9 are masked. The n-type thermoelectric semiconductor materials are then packed into the second perforations 9 such that the first perforations 8 are masked. In this step, a screen printing process is preferably used because perforations other than perforations to be filled with thermoelectric semiconductor materials are masked and therefore no masking member or masking step is required. In the packing step, the three types of thermoelectric semiconductor materials corresponding to the low-peak, medium-peak, and high-peak temperature portions 21, 22, and 23 or the low-peak, medium-peak, and high-peak temperature portions 24, 25, and 26 are packed into perforations 8 or 9, respectively, formed in other insulating sheets.

Through-holes for forming the extraction via-conductors 17 and 18 are formed in the insulating sheets. A conductive paste including Cu is packed into the through-holes.

The p-n connection conductors 11 and the extraction conductive layers 15 and 16 are formed on a specific one of the insulating sheets. The series wiring conductors 12 are formed on another specific one of the insulating sheets. The p-n connection conductors 11, the series wiring conductors 12, and the extraction conductive layers 15 and 16 are formed by a screen printing process using a conductive paste including Cu.

Portions of the extraction via-conductors 17 and 18 are formed in one of the insulating sheets and the terminal electrodes 19 and 20 are formed on this insulating sheet. The terminal electrodes 19 and 20 may be formed subsequently to a firing step below.

In order to prepare the laminate 3, the insulating sheets for forming the insulating layers 2 are stacked, the insulating sheets for forming the outer layers 13 and 14 are deposited on the stack and then pressed, and the compact is cut as required and then fired. As a result of firing, the insulating sheets are sintered into the insulating layers 2 and the outer layers 13 and 14, the p-type and n-type thermoelectric semiconductor materials are sintered into the p-type and n-type thermoelectric semiconductors 4 and 5, respectively, and the p-n connection conductors 11, the series wiring conductors 12, the extraction conductive layers 15 and 16, and the extraction via-conductors 17 and 18 are sintered, whereby the thermoelectric conversion module 1 is completed.

In the above stacking step, the insulating sheets, which have the perforations 8 and 9 filled with the three types of thermoelectric semiconductor materials, are stacked such that the laminate 3 is formed. Thus, the laminate 3 has a cascade structure shown in FIG. 2.

A sample that is substantially identical to the thermoelectric conversion module 1, shown in FIGS. 1 to 8, according to the first preferred embodiment was prepared. The sample included p-type thermoelectric semiconductors 4 made of Chromel, n-type thermoelectric semiconductors 5 made of Constantan, a laminate 3 having accommodation holes 6 and 7 with a diameter of about 200 μm, for example, and thermoelectric conversion element pairs 10. The laminate 3 had a thickness of about 300 μm, for example, before being fired. The thermoelectric semiconductors 4 and 5 were arranged at a pitch of about 400 μm, for example. The number of the thermoelectric conversion element pairs 10 per one square centimeter was 228. When a temperature difference of about 205 K was established between a pair of outer plates 13 and 14 such that one end of each of the thermoelectric semiconductors 4 and 5 was heated with a heater and the other end thereof was cooled with a fan, an output of about 1.4 W/cm$^2$ was obtained.

Figure 9:
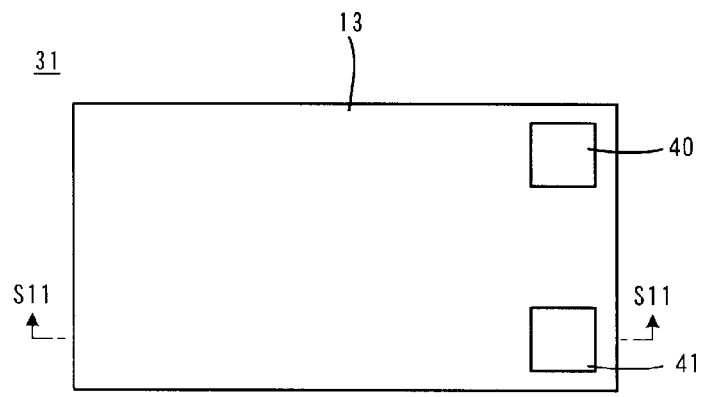
FIG. 9 is a plan view of a thermoelectric conversion module according to a second preferred embodiment of the present invention.
Figure 10:
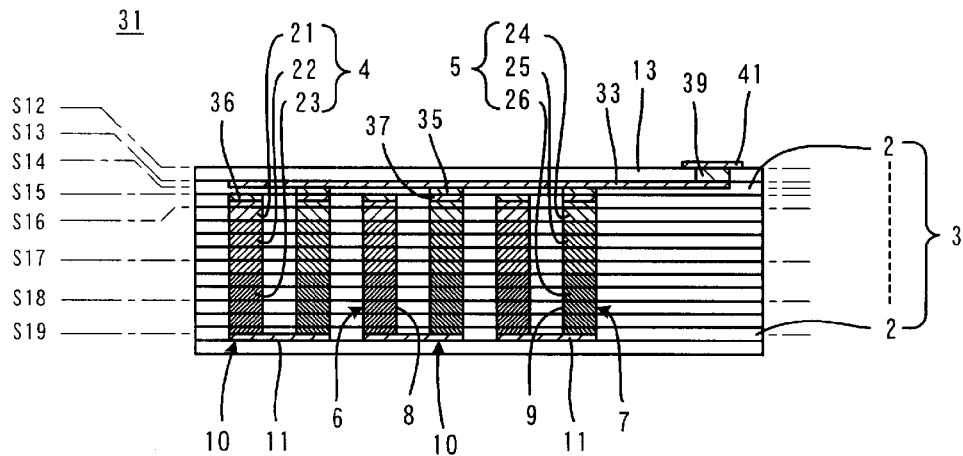
FIG. 10 is a sectional view taken along the line S11-S11 of FIG. 9.

FIGS. 9 to 18 are illustrations of a thermoelectric conversion module 31 according to a second preferred embodiment of the present invention. FIG. 9 is a plan view of the thermoelectric conversion module 31. FIG. 10 is a sectional view taken along the line S11-S11 of FIG. 9. FIGS. 11 to 18 are sectional plan views taken along the lines S12 to S19, respectively, of FIG. 10. In FIGS. 9 to 18, the same members as those shown in FIGS. 1 to 8 are denoted by the same reference numerals as those shown in FIGS. 1 to 8 and will not be redundantly described.

Figure 12:
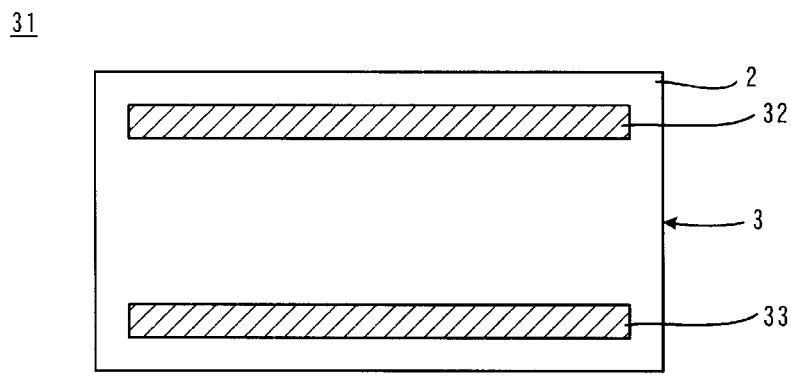
FIG. 12 is a sectional plan view taken along the line S13 of FIG. 10.
Figure 13:
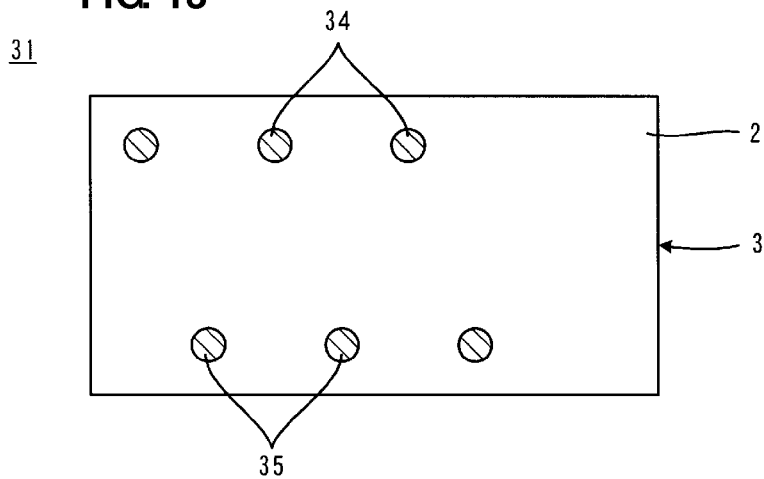
FIG. 13 is a sectional plan view taken along the line S14 of FIG. 10.
Figure 14:
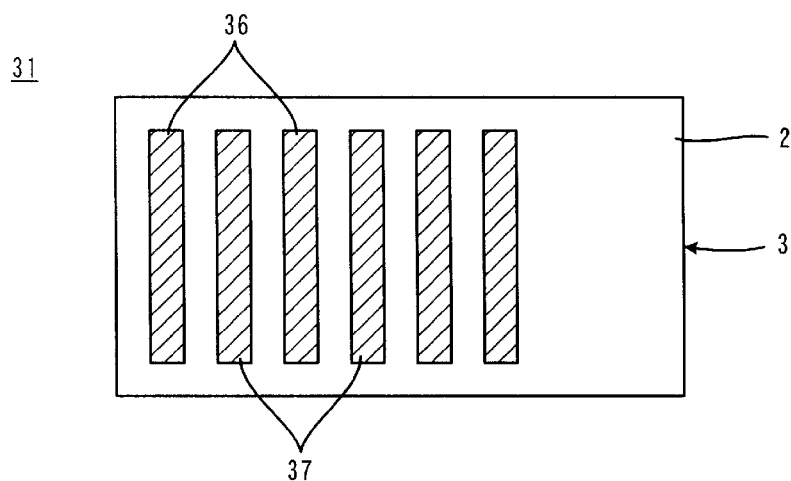
FIG. 14 is a sectional plan view taken along the line S15 of FIG. 10.

The thermoelectric conversion module 31 according to the second preferred embodiment includes a plurality of thermoelectric conversion element pairs 10 that are connected to each other in parallel. Therefore, a laminate 3 includes parallel wiring conductors 32 to 37 as shown in FIGS. 12 to 14. FIG. 12 shows the parallel wiring conductive layers 32 and 33, which extend along an insulating layer 2 and function as parallel wiring conductors. FIG. 13 shows the parallel wiring via-conductors 34 and 35, which extend in the thickness direction of an insulating layer 2 and function as parallel wiring conductors. FIG. 14 shows the parallel wiring conductive layers 36 and 37, which extend along an insulating layer 2 and function as parallel wiring conductors.

Figure 15:
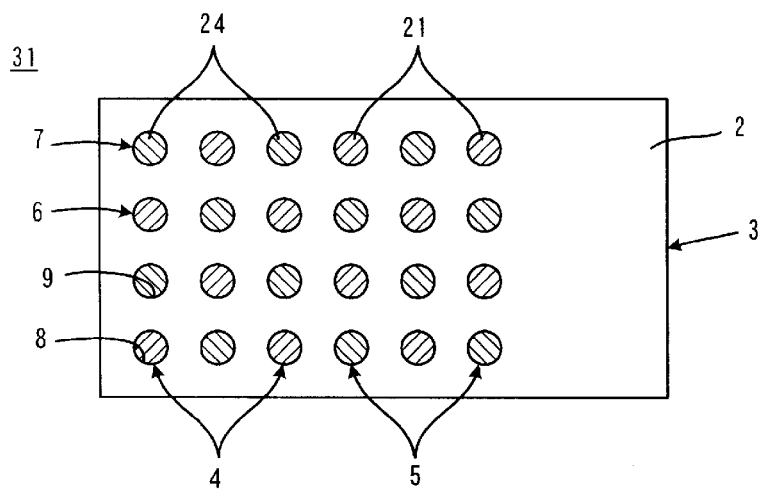
FIG. 15 is a sectional plan view taken along the line S16 of FIG. 10.
Figure 16:
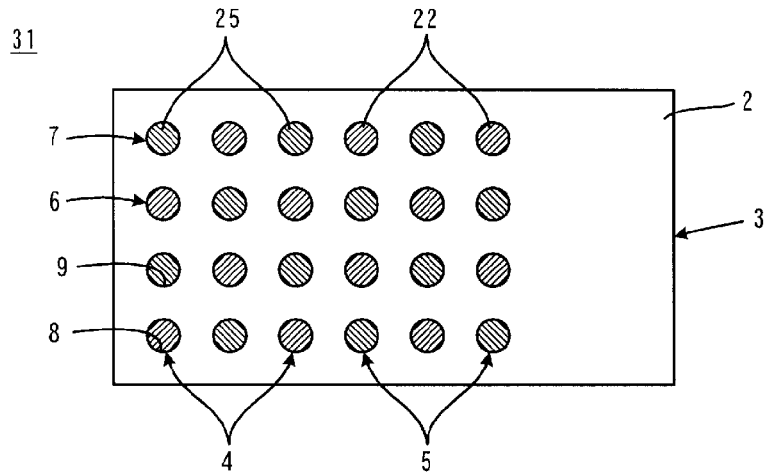
FIG. 16 is a sectional plan view taken along the line S17 of FIG. 10.
Figure 17:
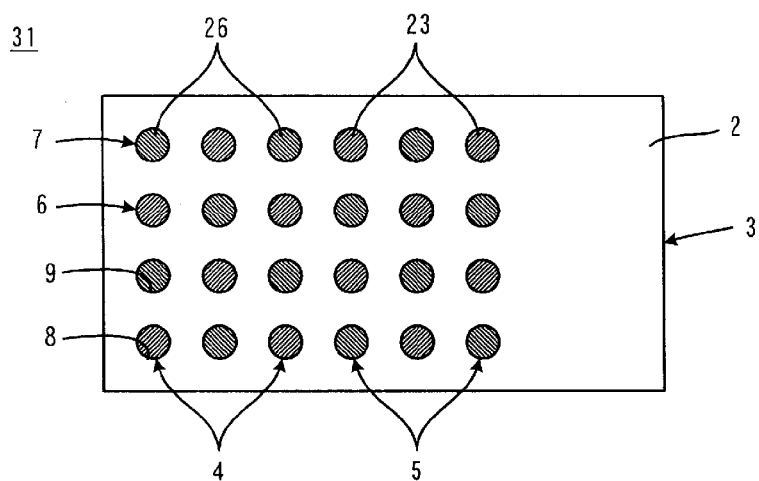
FIG. 17 is a sectional plan view taken along the line S18 of FIG. 10.
Figure 18:
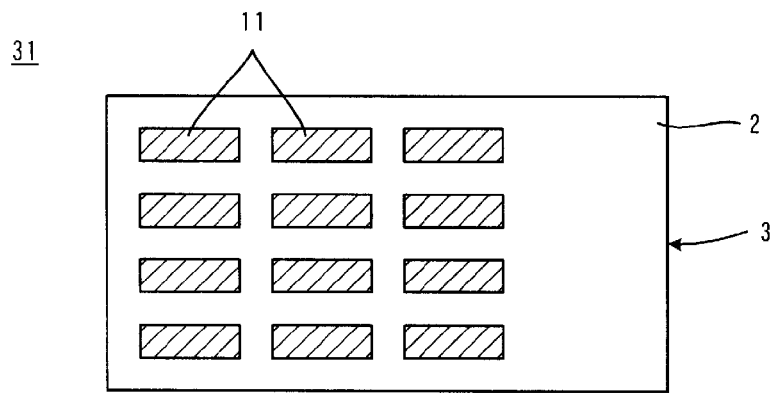
FIG. 18 is a sectional plan view taken along the line S19 of FIG. 10.

As is clear from the comparison of FIGS. 15 to 17 with FIG. 18, p-type thermoelectric semiconductors 4 and n-type thermoelectric semiconductors 5, as well as those described in the first preferred embodiment, form pairs and are electrically connected to each other in series through p-n connection conductors 11. These members define the thermoelectric conversion element pairs 10.

As is clear from the comparison of FIG. 14 with FIGS. 15 to 17, end portions of the thermoelectric conversion element pairs 10 that are arranged in the vertical direction in FIGS. 15 to 17 are connected to each other in parallel through the parallel wiring conductive layers 36 or 37. One of the parallel wiring conductive layers 36 is connected to one end portion of each of the thermoelectric conversion element pairs 10 and one of the parallel wiring conductive layers 37 is connected to the other end portion thereof. The parallel wiring conductive layers 36 and 37 are alternately arranged.

With reference to FIGS. 12 to 14, the parallel wiring conductive layers 36, which define a group, are connected to the parallel wiring conductive layer 32 through the parallel wiring via-conductors 34 and the parallel wiring conductive layers 37, which define another group, are connected to the parallel wiring conductive layer 33 through the parallel wiring via-conductors 35.

Figure 11:
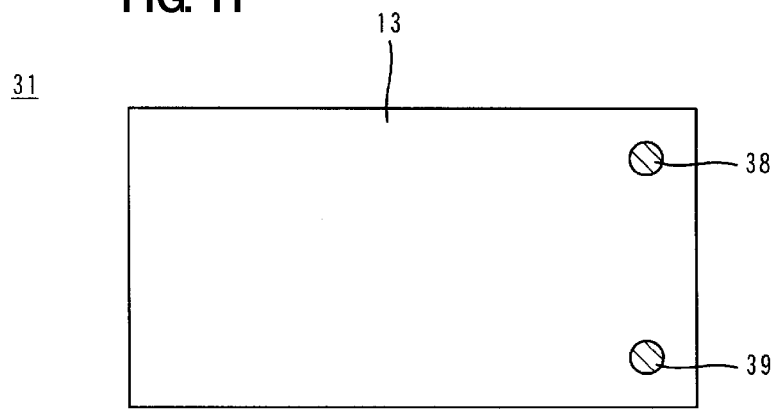
FIG. 11 is a sectional plan view taken along the line S12 of FIG. 10.

With reference to FIG. 11, extraction via-conductors 38 and 39 extend through an outer layer 13 in the thickness direction thereof. Terminal electrodes 40 and 41 are arranged on the outer surface of the outer layer 13. Therefore, as is clear from FIGS. 9, 11, and 12, the terminal electrode 40 is connected to the parallel wiring conductive layer 32 through the extraction via-conductor 38 and the terminal electrode 41 is connected to the parallel wiring conductive layer 33 through the extraction via-conductor 39.

The thermoelectric conversion module 31 has a configuration in which the thermoelectric conversion element pairs 10, which are connected to each other in parallel, are arranged between a pair of the terminal electrodes 40 and 41.

The thermoelectric conversion module 31 can be manufactured by substantially the same method as that for manufacturing the above-described thermoelectric conversion module 1 except that the following step is performed: a step of forming the parallel wiring conductive layers 32 and 33, the parallel wiring via-conductors 34 and 35, and the parallel wiring conductive layers 36 and 37 on specific insulating sheets.

Figure 19:
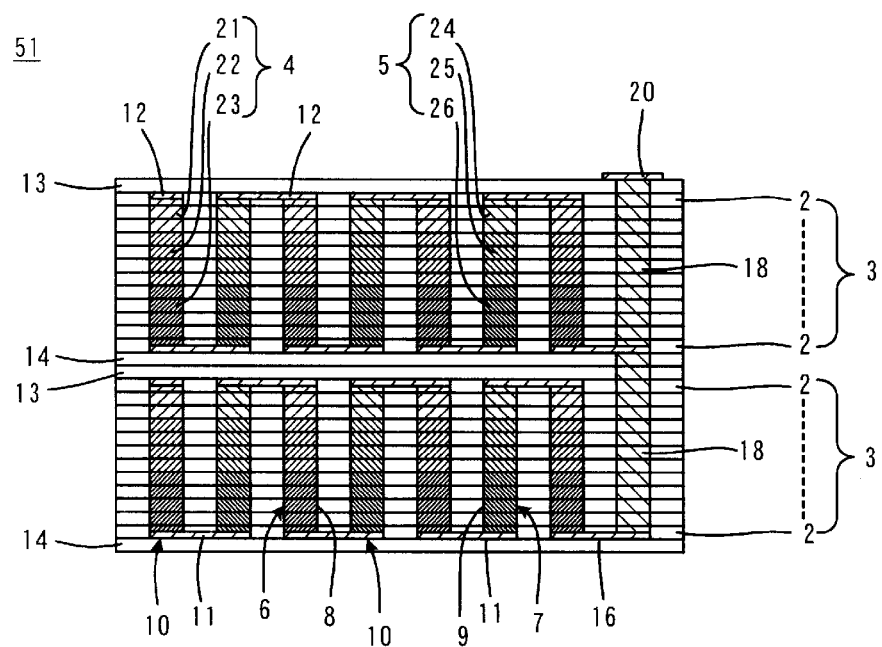
FIG. 19 is a plan view of a thermoelectric conversion module according to a third preferred embodiment of the present invention and corresponds to FIG. 2 or 10.

FIG. 19 is a sectional view of a thermoelectric conversion module 51 according to a third preferred embodiment of the present invention and corresponds to FIG. 2 or 10. In FIG. 19, the same members as those shown in FIG. 2 or 10 are denoted by the same reference numerals as those shown in FIG. 2 or 10 and will not be redundantly described.

The thermoelectric conversion module 51 according to the third preferred embodiment has a configuration in which a plurality of structures identical to the thermoelectric conversion module 1, shown in FIG. 2, including the thermoelectric conversion element pairs 10 connected to each other in series are connected to each other in parallel.

In particular, the structures, which correspond to the thermoelectric conversion module 1 shown in FIG. 2, each include extraction via-conductors 17 and 18 (the extraction via-conductors 17 not being shown in FIG. 19). The extraction via-conductors 17 and 18 are connected to each other, whereby the structures, which correspond to the thermoelectric conversion module 1 shown in FIG. 2, are electrically connected to each other in parallel.

The number of structures, which are included in the thermoelectric conversion module 51 shown in FIG. 19 and correspond to the thermoelectric conversion module 1 shown in FIG. 2, is two, and may, alternatively, be three or more as required.

A thermoelectric conversion module according to of the present invention is as described above with reference to the preferred embodiments and various modifications may be made.

When a thermoelectric conversion module includes a plurality of thermoelectric conversion element pairs, the thermoelectric conversion element pairs may be connected to each other by various techniques other than those described with reference to the foregoing figures. The number of the thermoelectric conversion element pairs may be arbitrarily varied. The present invention covers a thermoelectric conversion module including a single thermoelectric conversion element pair.

In the above preferred embodiments described with reference to the foregoing figures, the p-type and n-type thermoelectric semiconductors 4 and 5 each include the three portions in which the peak temperatures of thermoelectric figures of merit are different from each other. The number of such portions in which the peak temperatures of thermoelectric figures of merit are different from each other may be arbitrarily varied. Only the p-type or n-type thermoelectric semiconductors 4 or 5 may include such portions in which the peak temperatures of thermoelectric figures of merit are different from each other.

In the above preferred embodiments described with reference to the foregoing figures, the portions in which the peak temperatures of thermoelectric figures of merit are different from each other are arranged in the p-type and n-type thermoelectric semiconductors 4 and 5 in the same manner. In other words, if one of the insulating layers 2 arranged in the laminate 3 is examined, portions of the p-type and n-type thermoelectric semiconductors 4 and 5 in which the peak temperatures of thermoelectric figures of merit are the same are disposed in the perforations 8 and 9. The p-type or n-type thermoelectric semiconductors may include portions in which the peak temperatures of thermoelectric figures of merit are different from each other and which are disposed in a plurality of perforations.

In order to reduce the thermal stress applied to a thermoelectric conversion module, thermoelectric semiconductors and/or insulating sheets may be made of different materials or may have portions made of material having different thermal expansion coefficients. A material for forming the insulating sheets is not limited to ceramic or glass and a resin may be used to form the insulating sheets.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a thermoelectric conversion module that includes a p-type thermoelectric semiconductor, an n-type thermoelectric semiconductor, and a laminate including a plurality of insulating layers which are electrically insulative and which are stacked, the laminate having at least one first accommodation hole accommodating the p-type thermoelectric semiconductor, at least one second accommodation hole accommodating the n-type thermoelectric semiconductor, and a p-n connection conductor which electrically connects the p-type and n-type thermoelectric semiconductors to each other in series such that the p-type and n-type thermoelectric semiconductors define a thermoelectric conversion element pair, the first accommodation hole being defined by a plurality of first perforations which are communicatively connected to each other and which extend through the insulating layers in the thickness direction of the insulating layers, the second accommodation hole being defined by a plurality of second perforations which are communicatively connected to each other and which extend through the insulating layers in the thickness direction of the insulating layers, the method comprising:

a step of preparing a plurality of insulating sheets for forming the insulating layers;

a step of preparing a p-type thermoelectric semiconductor material for forming the p-type thermoelectric semiconductor and an n-type thermoelectric semiconductor material for forming the n-type thermoelectric semiconductor;

a step of forming the first and second perforations in the insulating sheets;

a step of packing the p-type thermoelectric semiconductor material and the n-type thermoelectric semiconductor material into the first perforation and the second perforation, respectively;

a step of forming the p-n connection conductor on specific one of the insulating sheets; and a step of stacking the insulating sheets such that the laminate is obtained; wherein the step of preparing the p-type thermoelectric semiconductor material and the n-type thermoelectric semiconductor material includes a sub-step of preparing different types of thermoelectric semiconductor components for producing at least one of the p-type thermoelectric semiconductor material and the n-type thermoelectric semiconductor material such that at least one of the p-type thermoelectric semiconductor and the n-type thermoelectric semiconductor includes a plurality of portions in which peak temperatures of thermoelectric figures of merit are different from each other;

the packing step includes a sub-step of packing the different types of thermoelectric semiconductor components into the first and second perforations of the insulating sheets; and the stacking step includes a sub-step of stacking the insulating sheets including the first and second perforations filled with the different types of thermoelectric semiconductor components such that the insulating sheets are arranged in the laminate in a mixed manner.

2. The thermoelectric conversion module-manufacturing method according to claim 1, further comprising a step of forming series wiring conductors on a specific one of the insulating sheets, wherein the laminate includes the series wiring conductors and a plurality of thermoelectric conversion element pairs connected to each other in series through the series wiring conductors.

3. The thermoelectric conversion module-manufacturing method according to claim 1, further comprising a step of forming parallel wiring conductors on a specific one of the insulating sheets, wherein the laminate includes the parallel wiring conductors and a plurality of thermoelectric conversion element pairs connected to each other in parallel through the parallel wiring conductors.

4. The thermoelectric conversion module-manufacturing method according to claim 1, further comprising a step of firing the laminate, the firing step being subsequent to the stacking step, wherein the insulating sheets are green ceramic sheets.

* * * * *